United States Patent
Jung

(10) Patent No.: US 6,985,391 B2
(45) Date of Patent: Jan. 10, 2006

(54) HIGH SPEED REDUNDANT DATA SENSING METHOD AND APPARATUS

(75) Inventor: Chul Min Jung, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/841,144

(22) Filed: May 7, 2004

(65) Prior Publication Data

US 2005/0248998 A1   Nov. 10, 2005

(51) Int. Cl.
*G11C 7/00* (2006.01)
(52) U.S. Cl. .................. 365/200; 365/189.02
(58) Field of Classification Search ........... 365/200, 365/189.02, 205, 207, 208
See application file for complete search history.

(56) References Cited

U.S. PATENT DOCUMENTS

| | | | |
|---|---|---|---|
| 5,424,987 A * | 6/1995 | Matsui | 365/200 |
| 5,572,470 A | 11/1996 | McClure et al. | |
| 5,708,619 A | 1/1998 | Gillingham | |
| 5,920,514 A | 7/1999 | Lim et al. | |
| 6,067,260 A | 5/2000 | Ooishi et al. | |
| 6,104,645 A | 8/2000 | Ong et al. | |
| 6,104,646 A * | 8/2000 | Haga | 365/200 |
| 6,327,197 B1 | 12/2001 | Kim et al. | |
| 6,343,037 B1 | 1/2002 | Park et al. | |
| 6,404,698 B1 * | 6/2002 | Inaba et al. | 365/230.06 |
| 6,496,425 B1 | 12/2002 | Abedifard et al. | |

* cited by examiner

*Primary Examiner*—Son Mai
(74) *Attorney, Agent, or Firm*—TraskBritt

(57) ABSTRACT

An apparatus and method for coupling a normal bit line pair and a second bit line pair onto a desired bit line pair are described. This method comprises driving the desired bit line pair to emulate the normal bit line pair during a read cycle. Additionally, if the second bit line pair is active, the apparatus and method include overdriving the desired bit line pair with strength sufficient to overpower the normal bit line pair, such that the desired bit line pair emulates the second bit line pair. Electrical current differences in the bit line pair may be sensed by a sense amplifier to assert or negate a data output such that it emulates the desired bit line pair. The normal bit line pair may be coupled to a normal memory column and the second bit line pair may be coupled to a redundant memory column.

38 Claims, 4 Drawing Sheets

HIGH SPEED REDUNDANT DATA SENSING METHOD AND APPARATUS

BACKGROUND OF THE INVENTION

1. Field of the Invention

This invention relates generally to semiconductor memory circuits, and particularly to circuits and methods for detecting redundant memory data to be used for replacing normal memory data.

2. State of the Art

Semiconductor memories generally include a multitude of memory cells arranged in rows and columns. Each memory cell is structured for storing digital information in the form of a "1" or a "0" bit. Many semiconductor memories include extra, i.e., redundant, memory cells that may be substituted for failing memory cells. Semiconductor memories are typically tested after they are fabricated to determine if they contain any failing memory cells (i.e., cells to which bits cannot be dependably written or from which bits cannot be dependably read). Generally, when a semiconductor memory is found to contain failing memory cells, an attempt is made to repair the memory by replacing the failing memory cells with redundant memory cells provided in redundant rows or redundant columns in the semiconductor memory.

Conventionally, when a redundant row is used to repair a semiconductor memory containing a failing memory cell, the failing cell's row address is permanently stored (typically in pre-decoded form) by programming nonvolatile elements (e.g., fuses, antifuses, Electrically Programmable Read-Only memory (EPROM), and FLASH memory cells) on the semiconductor memory. Then, during normal operation of the semiconductor memory, if the memory's addressing circuitry receives a memory address including a row address that corresponds to the row address stored on the chip, redundant circuitry in the memory causes access to a redundant row instead of the row identified by the received memory address. Since every memory cell in the failing cell's row has the same row address, the redundant row replaces every cell in the failing cell's row, both operative and failing, with the redundant memory cells in the redundant row.

Similarly, when a redundant column is used to repair the semiconductor memory, the failing cell's column address is permanently stored (typically in pre-decoded form) on the chip by programming nonvolatile elements on the chip. Then, during normal operation of the semiconductor memory, if the memory's addressing circuitry receives a memory address including a column address that corresponds to the column address stored on the chip, redundant circuitry in the memory causes a redundant memory cell in the redundant column to be accessed instead of, or simultaneously with, the memory cell identified by the received memory address. Since every memory cell in the failing cell's column has the same column address, every cell in the failing cell's column, both operative and failing, is replaced by a redundant memory cell in the redundant column. This process for repairing a semiconductor memory using redundant rows and columns is well known in the art.

Concerning redundant memory columns, various methods exist for selecting whether to use the normal memory column or the redundant memory column. As access times continue to decrease for memory devices, this normal versus redundant selection process for memory columns begins to take up a larger portion of the overall access time from a valid address into the memory array to a valid data signal out of the memory array. Conventionally, redundant memory column selection has involved some sort of multiplexer to select either the data bit pair (BIT and BIT*) from the normal memory column or the data bit pair for the redundant memory column. The multiplexer may occur in various places. In some implementations, the multiplexer may be positioned as directly after the normal and redundant memory columns (i.e., directly attached to the BIT and BIT* signals). In other implementations, a sense amplifier may be connected to the normal memory column and another sense amplifier may be connected to the redundant memory column, with the multiplexer connected to the outputs of the sense amplifiers. In yet other implementations, logic may be implemented to prevent the read cycle from taking place on the normal memory column when the redundant memory column is to be selected in place of the normal memory column. All of these implementations tend to slow the read process down relative to a column read without a redundant memory column. In the multiplexer implementations, the normal data may go through a longer, and therefore slower, logic path including the multiplexer. In addition, decode logic for the multiplexer select signal may be slow. In the normal memory column disabling implementation, the logic required to determine when to disable might add additional time to the read path.

It would be advantageous to provide an apparatus and method for allowing selection of a redundant memory column rather than the normal memory column that does not create any additional delay in the normal memory column access time and enables access times on the redundant memory column that are at least as fast as that for the normal memory column.

BRIEF SUMMARY OF THE INVENTION

One embodiment of the present invention includes a method of coupling a normal bit line pair and a second bit line pair onto a desired bit line pair. This method comprises driving the desired bit line pair to emulate the normal bit line pair during a read cycle. Additionally, if the second bit line pair is active, the method includes overdriving the desired bit line pair with strength sufficient to overpower the normal bit line pair, such that the desired bit line pair emulates the second bit line pair. Electrical current differences in the desired bit line pair may be sensed by a sense amplifier to assert or negate a data output such that it emulates the desired bit line pair. The normal bit line pair may be coupled to a normal memory column and the second bit line pair may be coupled to a redundant memory column.

Another embodiment of the present invention comprises generating a desired data current on a desired data signal and generating an inverted desired data current on an inverted desired data signal. The resulting desired data current and inverted desired data current may be sensed to assert a data output when the desired data current is larger than the inverted desired data current and negate the data output when the desired data current is smaller than the inverted desired data current. The desired data current may be generated by enabling a first current onto the desired data signal when a normal data signal is asserted and enabling a first redundant current, substantially exceeding the first current, onto the desired data signal when an inverted redundant data signal is de-asserted. Similarly, the inverted desired data current may be generated by enabling a second current onto the inverted desired data signal when an inverted normal data signal is asserted and enabling a second redundant current, substantially exceeding the second current, onto the inverted desired data signal when a redundant data signal is de-asserted. Additionally, generating the desired data current and generating the inverted desired data current may be set to occur when an enable signal is asserted.

Another embodiment of the present invention includes a selection module comprising a plurality of selectors for generating a desired data current on a desired data signal and an inverted desired data current on an inverted desired data signal. A first selector may be configured to generate a first current when an enable signal is asserted and a normal data signal is asserted. A first redundant selector may be configured to generate a first redundant current when the enable signal is asserted and an inverted redundant data signal is asserted. The desired data current may be a combination of the first current and the first redundant current. However, when the first redundant current is present, it may substantially exceed the first current such that the desired data current may be comprised primarily of the first redundant current.

A second selector may be configured to generate a second current when the enable signal is asserted and an inverted normal data signal is de-asserted. A second redundant selector may be configured to generate a second redundant current when the enable signal is asserted and a redundant data signal is de-asserted. The inverted desired data current may be a combination of the second current and the second redundant current. However, when the second redundant current is present, it may substantially exceed the second current such that the inverted desired data current may be comprised primarily of the second redundant current.

A current sensor may be configured to assert a data output when the desired data current is larger than the inverted desired data current and to de-assert the data output when the desired data current is smaller than the inverted desired data current.

Another embodiment of the invention comprises a memory device including a plurality of normal memory columns, a plurality of redundant memory columns, and a plurality of selection modules as described above. Each normal memory column includes a normal bit line pair comprising a normal data signal and an inverted normal data signal. Similarly, each redundant memory column includes a redundant bit line pair comprising a redundant data signal and an inverted redundant data signal. Each of the plurality of selection modules may connect to a normal memory column and a redundant memory column for selecting the redundant bit line pair, if active, rather than the normal bit line pair.

Another embodiment of the present invention includes a plurality of semiconductor devices, incorporating the memory device including the selection module according to the present invention, fabricated on a semiconductor wafer.

Yet another embodiment, in accordance with the present invention comprises an electronic system comprising an input device, an output device, a processor, and a memory device. The memory device comprises at least one semiconductor memory incorporating the memory device including the selection module according to the invention described herein.

BRIEF DESCRIPTION OF THE DRAWINGS

In the drawings, which illustrate what is currently considered to be the best mode for carrying out the invention.

In the following description, circuits may be shown in block diagram form so as not to obscure the present invention in unnecessary detail. Additionally, block definitions and partitioning of logic between various blocks is exemplary of a specific implementation. It will be obvious to one of ordinary skill in the art that the present invention may be practiced by numerous other partitioning solutions. For the most part, details concerning timing considerations and the like have been omitted inasmuch as such details are not necessary to obtain a complete understanding of the present invention and are within the skills of persons of ordinary skill in the relevant art.

The terms "assert" and "negate" are respectively used when referring to the rendering of a signal, status bit, or similar apparatus into its logically true or logically false state. If the logically true state is a logic level one, the logically false state will be a logic level zero. Conversely, if the logically true state is a logic level zero, the logically false state will be a logic level one.

Figure 1:
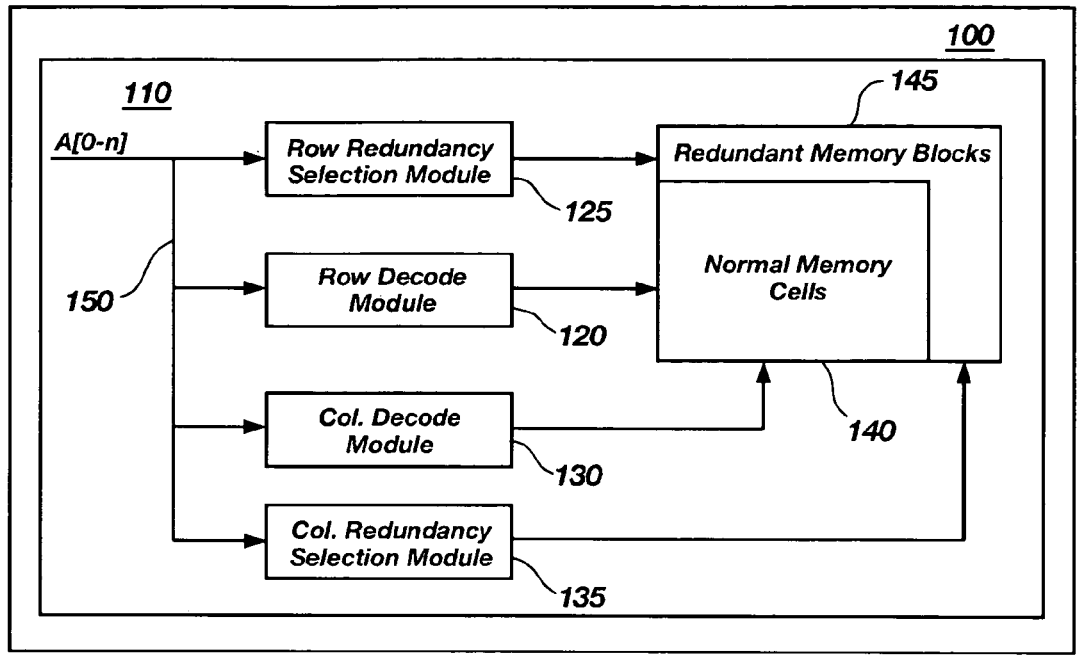
FIG. 1 is a block diagram of an exemplary memory bank in a semiconductor memory showing redundancy selection modules for selecting redundant memory blocks rather than normal memory cells.

FIG. 1 is a block diagram of an exemplary memory bank 110 in a semiconductor memory 100 in accordance with an embodiment of the present invention. A row decode module 120 accepts address inputs 150 for decoding into select signals for each row within a normal memory cell array 140. Similarly, a column decode module 130 accepts address inputs 150 for decoding into select signals for each column within the normal memory cell array 140. At least one row redundancy selection module 125 accepts address inputs 150 for decoding and comparing to selected address values such that redundant row selection signals may be generated for each redundant row within the redundant memory cell array if the address inputs 150 match the selected address values. Similarly, at least one column redundancy selection module 135 accepts address inputs 150 for decoding and comparing to selected address values such that redundant columns selection signals may be generated for each redundant column within the redundant memory cell array. Redundant rows and redundant columns may be referred to herein generically as redundant memory blocks 145.

The block diagram shown in FIG. 1 is illustrative of a single memory bank 110. Many modern semiconductor memories are physically organized essentially as a plurality of memory banks 110 configured as a square or rectangle of memory bits such that multiple bits are addressed for each memory address comprised of a combined row and column address. The number of bits addressed with each memory address may vary, with exemplary amounts being 4, 8, and 16 bits per memory address. As an example memory architecture, a 512 Mbit DRAM may be separated into four banks, each bank containing 128 Mbits. Each bank may typically be configured as 8K rows. Each bank may typically comprise 16K columns, which may be organized as 4K columns of four bits, 2K columns of eight bits, or 1K columns of 16 bits. Conventional memory addressing is well known to those skilled in the art, therefore, it is not described in detail herein. Additionally, the arrays of normal memory cells and redundant memory blocks 145 may be segmented into smaller portions to aid in address decoding.

Figure 2:
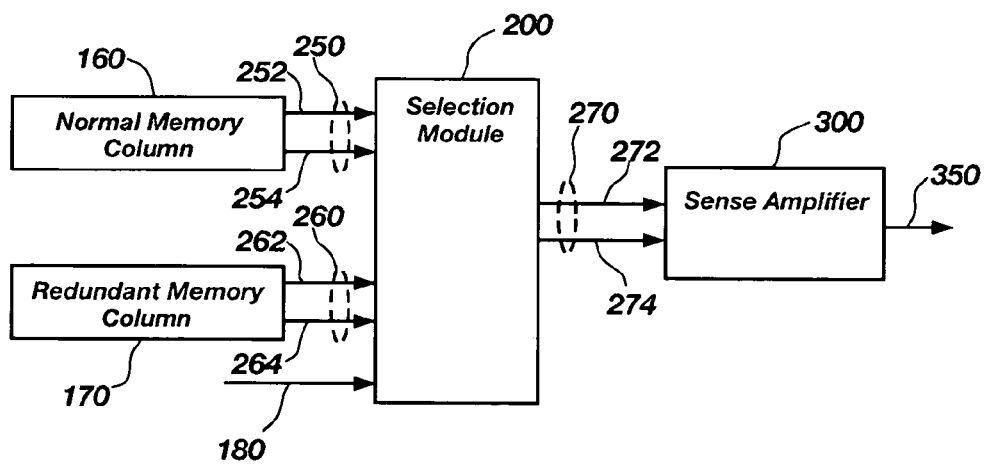
FIG. 2 is a block diagram of an exemplary selection module showing connections to a normal memory column, a redundant memory column, and a sense amplifier.

FIG. 2 is an exemplary embodiment of a selection module 200 and other modules in communication with the selection module 200. The selection module 200 may be logically located at the outputs of a normal memory column 160 and a redundant memory column 170. A normal memory column 160 addressed during a read cycle may generate signals on a normal bit line pair 250 comprised of a normal data signal 252 (also shown as ND in the drawings) and an inverted normal data signal 254 (also shown as ND* in the drawings). A redundant memory column 170, if it is enabled to replace the normal memory column 160 addressed during the read cycle, may generate signals on a second bit line pair 260 (also referred to as a redundant bit line pair 260) comprised of a redundant data signal 262 (also shown as RD in the drawings) and an inverted redundant data signal 264 (also shown as RD* in the drawings). The selection module 200 combines the normal bit line pair 250 and the second bit line pair 260 into a desired bit line pair 270 when an enable signal 180 is asserted. The desired bit line pair 270 includes current mode signals comprised of a desired data signal 272 (also shown as DD in the drawings) and an inverted desired data signal 274 (also shown as DD* in the drawings), which connect to a sense amplifier 300. The sense amplifier 300 (also referred to as a current sensor) provides a current sink for the desired bit line pair 270 and senses small differences in current between the desired data signal 272 and the inverted desired data signal 274 to generate a data output 350.

Figure 3:
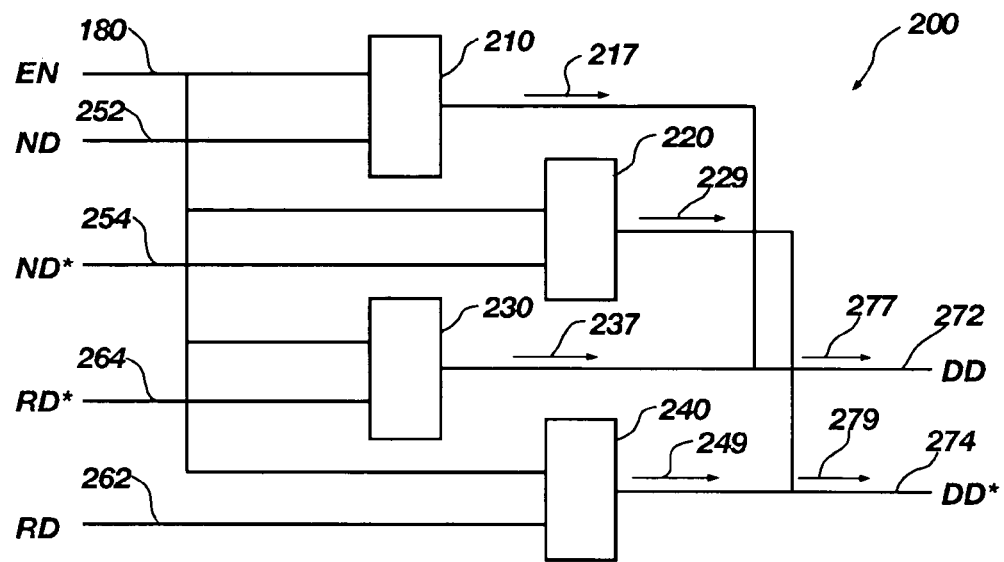
FIG. 3 is a block diagram of an exemplary selection module.

FIG. 3 illustrates an exemplary embodiment, in block diagram form, of the selection module 200. The normal data signal 252 from the normal memory column 160 connects to a first selector 210. The inverted normal data signal 254 from the normal memory column 160 connects to a second selector 220. The inverted redundant data signal 264 from the redundant memory column 170 connects to a first redundant selector 230. Finally, the redundant data signal 262 connects to a second redundant selector 240. The enable signal 180 connects to all the current sources (i.e., selectors 210, 220, 230, and 240). When the enable signal 180 is asserted, the current sources (selectors 210, 220, 230, and 240) may source current onto their respective outputs, depending on the state of their respective data inputs (i.e., signals 252, 254, 262, and 264).

The first selector 210 may drive a first current 217 onto the desired data signal 272. Similarly, the first redundant selector 230 may drive a first redundant current 237 onto the desired data signal 272. The outputs of the first selector 210 and the first redundant selector 230 are tied together such that the first current 217 and the first redundant current 237 combine to create a desired data current 277.

An inverted desired data signal 274 is generated in a similar fashion. The second selector 220 may drive a second current 229 onto the inverted desired data signal 274. Similarly, the second redundant selector 240 may drive a second redundant current 249 onto the inverted desired data signal 274. The outputs of the second selector 220 and the second redundant selector 240 are tied together such that the second current 229 and the second redundant current 249 combine to create an inverted desired data current 279. As will be explained later, the sense amplifier 300 acts as a current sink for the resultant desired data current 277 and inverted desired data current 279.

Figure 4:
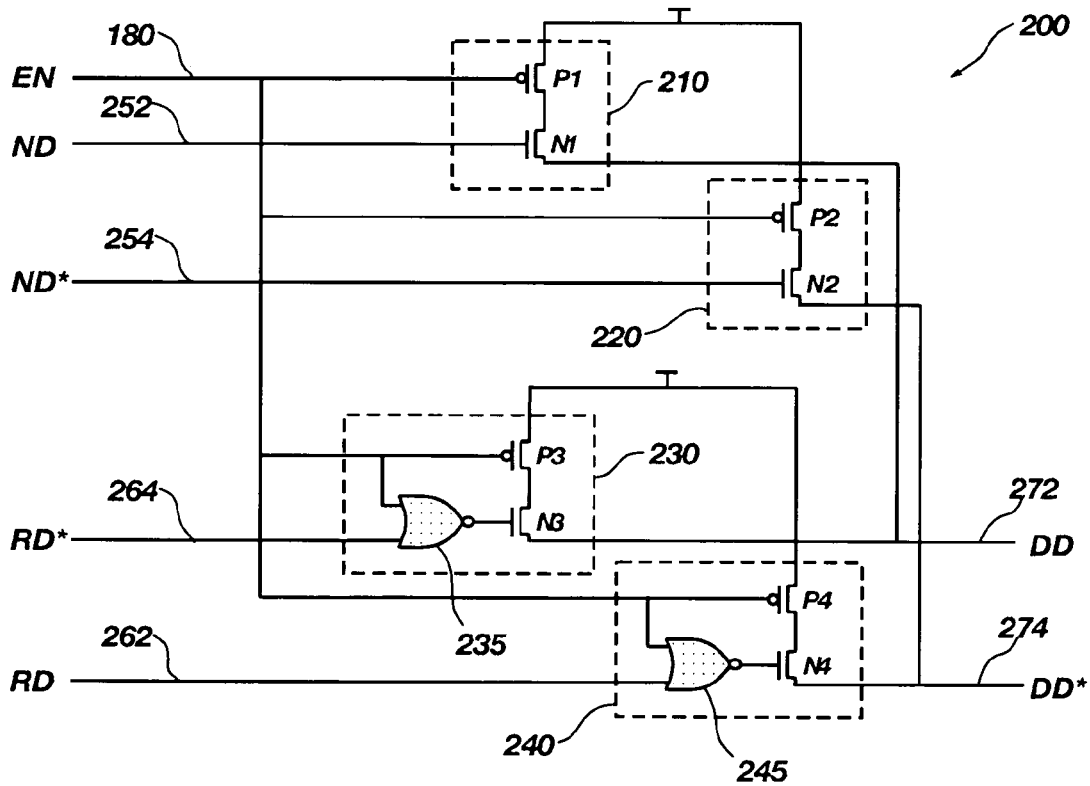
FIG. 4 is a block diagram showing an exemplary circuit implementation of the exemplary selection module.

FIG. 4 shows an exemplary circuit implementation of the selection module 200. In the exemplary circuit implementation, the first selector 210 includes a first p-channel transistor P1 with its source connected to a voltage source (VCC) and its gate connected to the enable signal 180. A first n-channel transistor N1 connects in series with the first p-channel transistor P1 in a source follower configuration. On the first n-channel transistor N1, the gate connects to the normal data signal 252 and the drain connects to the desired data signal 272. The first redundant selector 230 is somewhat different. A third p-channel transistor P3 has its source connected to VCC and its gate connected to the enable signal 180. The enable signal 180 also connects to an input of a first NOR gate 235 in the first redundant selector 230. A third n-channel transistor N3 connects in series with the third p-channel transistor P3 in a source follower configuration. On the third n-channel transistor N3, the gate connects to the output of the first NOR gate 235 and the drain connects to the desired data signal 272. The inverted redundant data signal 264 connects to the other input of the first NOR gate 235.

In generating the inverted desired data signal 274, the second selector 220 includes a second p-channel transistor P2 with its source connected to VCC and its gate connected to the enable signal 180. A second n-channel transistor N2 connects in series with the second p-channel transistor P2 in a source follower configuration. On the second n-channel transistor N2, the gate connects to the inverted normal data signal 254 and the drain connects to the inverted desired data signal 274. For the second redundant selector 240, a fourth p-channel transistor P4 has its source connected to VCC and its gate connected to the enable signal 180. The enable signal 180 also connects to an input of a second NOR gate 245 in the second redundant selector 240. A fourth n-channel transistor N4 connects in series with the fourth p-channel transistor P4 in a source follower configuration. On the fourth n-channel transistor N4, the gate connects to the output of the second NOR gate 245 and the drain connects to the inverted desired data signal 274. The redundant data signal 262 connects to the other input of the second NOR gate 245.

In the selection module 200, the first redundant selector 230 and second redundant selector 240 have stronger current drive capabilities than the first selector 210 and second selector 220 because the third n-channel transistor N3 and fourth n-channel transistor N4 are larger than the first n-channel transistor N1 and second n-channel transistor N2. As a result, the redundant current sources (i.e., selectors 230 and 240) are capable of overdriving (i.e., contributing a larger current) the normal current sources (i.e., selectors 210 and 220).

Figure 5:
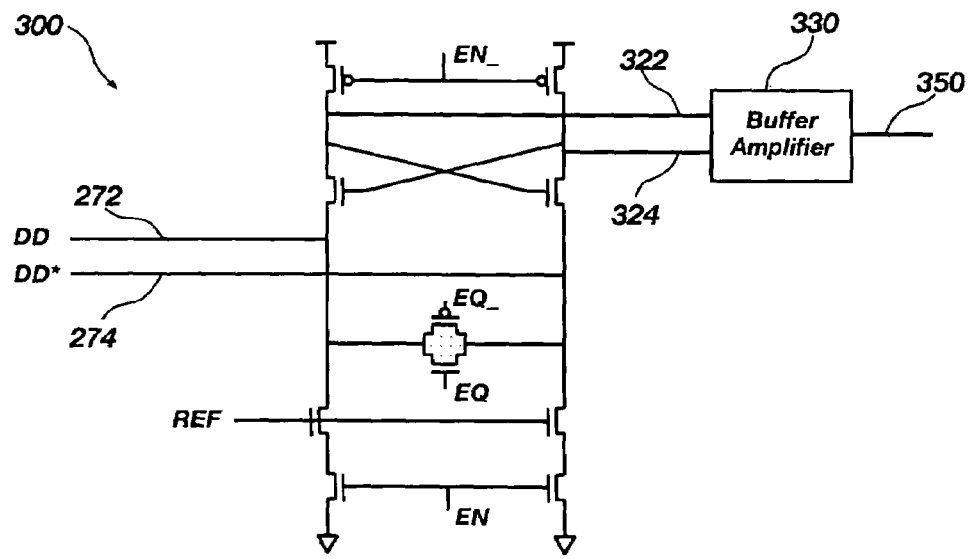
FIG. 5 is a diagram of an exemplary sense amplifier.

A conventional sense amplifier 300 is shown in FIG. 5. The sense amplifier 300 is shown to illustrate its ability to sink the currents generated by the selector and its ability to amplify the small current differences between the desired data signal 272 and the inverted desired data signal 274. In the sense amplifier 300, the two n-channel transistors at the bottom of the stack are controlled by a sense amplifier enable, so the sense amplifier 300 does not draw current except during a read cycle. Similarly, the two p-channel transistors at the top of the stack connect to an inverted version of the sense amplifier enable. The two n-channel transistors are connected to a bias voltage (REF), which defines the current sinking capability of the sense amplifier 300. The two cross-coupled n-channel transistors perform the sensing and amplification to generate an intermediate output 322 and an inverted intermediate output 324. These intermediate signals may optionally enter a buffer amplifier 330, which may contain additional sense amplifiers 300, circuits to generate a typical CMOS data output 350, or both.

Figure 6:
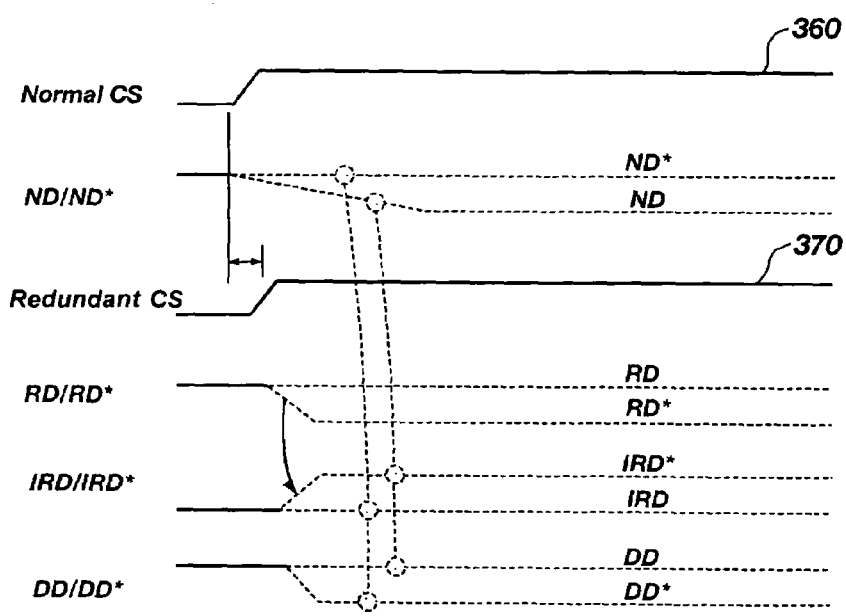
FIG. 6 is a timing diagram illustrating operation of the exemplary selection module.

FIG. 6 is a timing diagram illustrating operation of the exemplary selection module 200. For purposes of this discussion, both signals of the normal bit line pair 250 and both signals of the redundant bit line pair 260 are pre-charged to at or near a high level prior to the read. During the read cycle a "one" from a memory cell causes a low on the inverted signal while a high remains on the non-inverted signal for the column in which the memory cell is located. A "zero" reads as the opposite, i.e., a high remains on the inverted signal while the non-inverted signal transitions to a low.

The following discussion describes a memory read cycle where the normal memory column 160 reads a "zero" while the redundant memory column 170 reads a "one." The result out of the sense amplifier 300 is the "one" from the redundant memory column 170, which overpowers the "zero" from the normal memory column 160.

In operation, referring to FIGS. 4 and 6, a read process may begin with the assertion of a normal chip select 360 for the normal memory column 160. A selected memory cell in the normal memory column 160 may begin driving the normal data signal 252 and the inverted normal data signal 254. Once the read cycle starts, the inverted normal data signal 254 (shown as ND* in the timing diagram of FIG. 6) remains negated by staying at the pre-charged level while the normal data signal 252 (shown as ND in the timing diagram of FIG. 6) begins dropping to a negated level, indicating that a "zero" is being read from the memory cell. Whichever signal is to drop in the normal bit line pair 250, may drop relatively slowly because there are relatively long routing lines, creating a larger capacitive load, on the normal bit line pair 250. Assuming the enable signal 180 is asserted, the high remaining on the inverted normal data signal 254, which drives the gate of the second n-channel transistor N2, results in the second selector 220 driving the second current 229 on the inverted desired data signal 274. In addition, as the normal data signal 252 falls, the first selector 210 begins to reduce the magnitude of the first current 217, driven on the desired data signal 272, due to the falling voltage on the gate of the first n-channel transistor N1.

After the normal chip select 360 is asserted, decoding takes place (not shown) to determine that a redundant memory column 170 may be needed to replace the normal memory column 160, which generates a redundant chip select 370. As a result of the redundant chip select 370, a memory cell on the redundant memory column 170 may begin driving a "one," causing the inverted redundant data signal 264 (shown as RD* in the timing diagram of FIG. 6) to fall to a low asserted level, while the redundant data signal 262 (shown as RD in the timing diagram of FIG. 6) remains at a high asserted level. Whichever signal is to drop in the redundant bit line pair 260, may drop relatively quickly because there are relatively short routing lines, creating a smaller capacitive load, on the redundant bit line pair 260. Assuming the enable signal 180 is asserted, the high remaining on the redundant data signal 262 is inverted (shown as IRD in the timing diagram of FIG. 6) by the second NOR gate 245, which drives a low on the gate of the fourth n-channel transistor N4, thereby shutting off the second redundant current 249. In addition, as the inverted redundant data signal 264 falls, the first NOR gate 235 inverts (shown as IRD* in the timing diagram of FIG. 6) the inverted normal data signal 254 to a high on the gate of the third n-channel transistor N3. The rising gate voltage on the relatively large third n-channel transistor N3 causes a relatively large first redundant current 237 to flow onto the desired data signal 272.

The first redundant current 237, which is flowing from the strong third n-channel transistor N3, combines with the first current 217, which is waning from the weak first n-channel transistor N1 turning off, resulting in a relatively strong desired data current 277. On the other hand, the second redundant current 249 from the strong fourth n-channel transistor N4 is shutting off, while the second current 229 is strengthening, but from the weaker second n-channel transistor N2. The second current and second redundant current combine to generate an inverted desired data current 279, which is small relative to the strong desired data current 277. The sense amplifier 300 detects the relatively strong desired data current 277 (which attempts to drive the desired data signal 272 high) and the relatively weak inverted desired data current 279 (which cannot drive the inverted desired data signal 274 as high) resulting in a "one" being detected.

If the redundant memory column 170 remains disabled, perhaps because it is not needed, the redundant bit line pair 260 will remain high during a read cycle. Those highs are inverted by the first and second NOR gates (235 and 245, respectively), resulting in lows on the gates of the third n-channel transistor N3 and fourth n-channel transistor N4. Consequently, the first redundant current 237 and second redundant current 249 are at or near zero allowing the desired data current 277 and inverted desired data current 279 to be controlled by the first current 217 and second current 229 respectively. For this example of a "zero" being read from the normal memory column 160, the normal data signal 252 goes low, which begins to turn off the first n-channel transistor N1 causing a relatively small first current 217. Since there is little or no first redundant current 237, the desired data current 277 is substantially the same as the first current 217. On the inverted data side, the inverted normal data signal 254 remains high allowing the second n-channel transistor N2 to conduct and drive the second current 229. As with the desired data current 277, the inverted desired data current 279 follows the second current 229 because the second redundant current 249 is at or near zero. As a result, the inverted desired data current 279 is larger than the desired data current 277, which the sense amplifier 300 interprets as a "zero."

Figure 7:
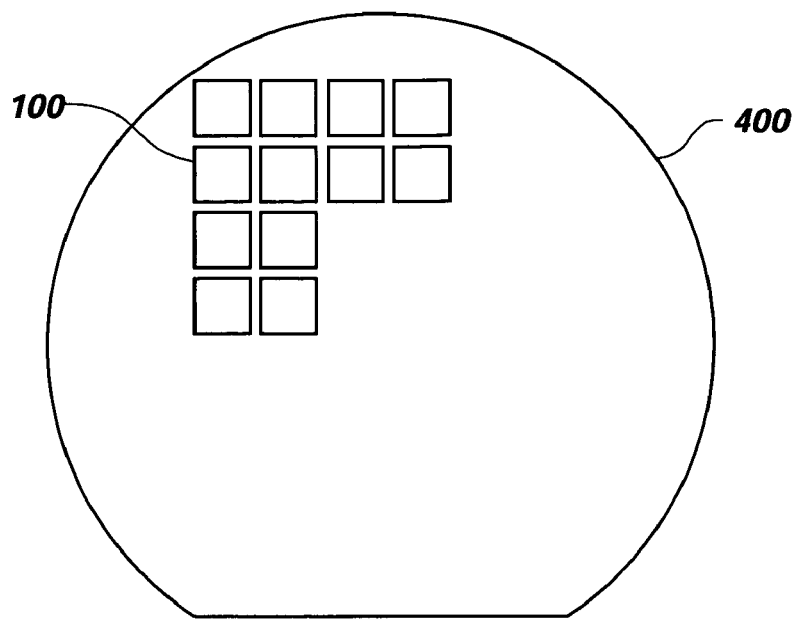
FIG. 7 is a semiconductor wafer containing a plurality of semiconductor memories containing redundancy selection modules.

As shown in FIG. 7, a semiconductor wafer 400, in accordance with the present invention, includes a plurality of semiconductor memories 100 incorporating the high speed redundant data sensing architecture described herein. Of course, it should be understood that the semiconductor memories 100 may be fabricated on substrates other than a silicon wafer, such as, for example, a Silicon On Insulator (SOI) substrate, such as, for example, a Silicon On Glass (SOG) substrate, or a Silicon On Sapphire (SOS) substrate, a gallium arsenide wafer, an indium phosphide wafer, or other bulk semiconductor substrate. As used herein, the term "wafer" includes and encompasses all such substrates.

Figure 8:
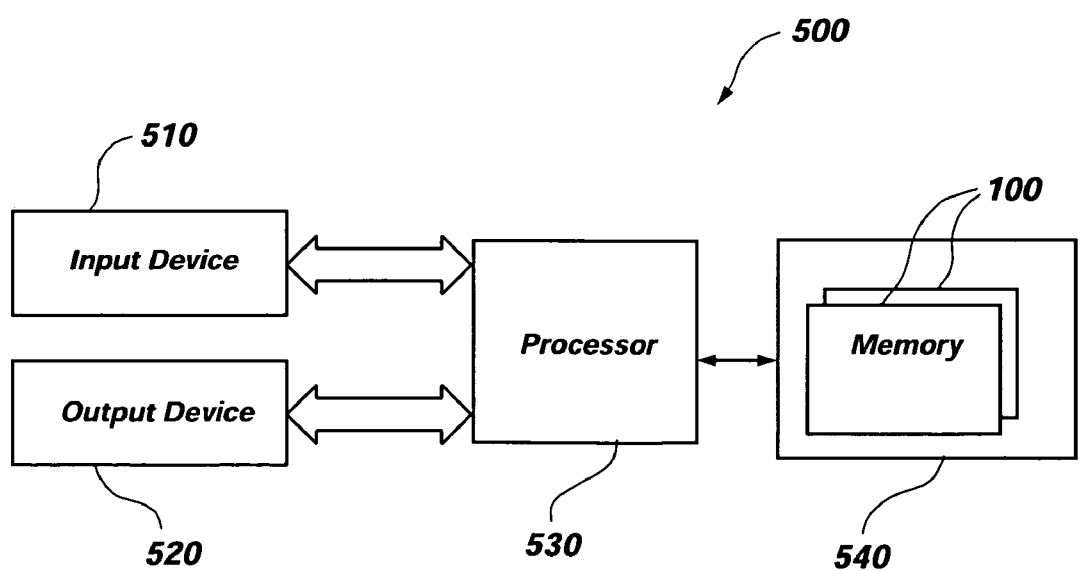
FIG. 8 is a computing system diagram showing a plurality of semiconductor memories containing redundancy selection modules.

As shown in FIG. 8, an electronic system 500, in accordance with the present invention, comprises an input device 510, an output device 520, a processor 530, and a memory device 540. The memory device 540 comprises at least one semiconductor memory 100 incorporating the high speed redundant data sensing architecture described herein in a DRAM device. It should be understood that the semiconductor memory 100 may comprise a wide variety of devices other than, or in addition to, a DRAM, including, for example, Static RAM (SRAM) devices, and Flash memory devices.

Although this invention has been described with reference to particular embodiments, the invention is not limited to these described embodiments. Rather, the invention is limited only by the appended claims, which include within their scope all equivalent devices or methods that operate according to the principles of the invention as described.

What is claimed is:

1. A method of coupling a normal bit line pair and a second bit line pair, comprising:
    driving a desired bit line pair to emulate the normal bit line pair during a read cycle; and
    overdriving the desired bit line pair, if the second bit line pair is active, to emulate the second bit line pair during the read cycle with a strength sufficient to overpower the normal bit line pair.

2. The method of claim 1, further comprising:
    sensing the desired bit line pair to drive a data output that emulates the desired bit line pair.

3. The method of claim 1, further comprising providing the second bit line pair as a redundant bit line pair coupled to redundant memory cells.

4. The method of claim 1, further comprising coupling the normal bit line pair to normal memory cells.

5. The method of claim 1, wherein driving the desired bit line pair and overdriving the desired bit line pair occur while an enable signal is asserted.

6. The method of claim 1, wherein driving the desired bit line pair comprises:
    generating a desired data current on a desired data signal of the desired bit line pair when an enable signal is asserted and a normal data signal of the normal bit line pair is asserted; and
    generating an inverted desired data current on an inverted desired data signal of the desired bit line pair when the enable signal is asserted and an inverted normal data signal of the normal bit line pair is negated.

7. The method of claim 6, wherein overdriving the desired bit line pair comprises:
    contributing to the desired data current on the desired data signal of the desired bit line pair when the enable signal is asserted and an inverted redundant data signal of the redundant bit line pair is asserted; and
    contributing to the inverted desired data current on the inverted desired data signal of the desired bit line pair when an enable signal is asserted and a redundant data signal of the redundant bit line pair is negated.

8. The method of claim 7, further comprising:
    sensing the desired data current as larger than the inverted desired data current to assert a data output and sensing the desired data current as smaller than the inverted desired data current to negate the data output.

9. A method, comprising:
    generating a desired data current on a desired data signal, comprising:
        enabling a first current onto the desired data signal when a normal data signal is asserted; and
        enabling a first redundant current, substantially exceeding the first current, onto the desired data signal when an inverted redundant data signal is negated; and
    generating an inverted desired data current on an inverted desired data signal, comprising:
        enabling a second current onto the inverted desired data signal when an inverted normal data signal is asserted;
        enabling a second redundant current, substantially exceeding the second current, onto the inverted desired data signal when a redundant data signal is negated.

10. The method of claim 9, further comprising:
    sensing the desired data current and the inverted desired data current to assert a data output when the desired data current is larger than the inverted desired data current and negate the data output when the desired data current is smaller than the inverted desired data current.

11. The method of claim 9, wherein generating the desired data current and generating the inverted desired data current occur when an enable signal is asserted.

12. A selection module, comprising:
    a first selector configured to generate a first current when an enable signal is asserted and a normal data signal is asserted;
    a first redundant selector configured to generate a first redundant current when the enable signal is asserted and an inverted redundant data signal is asserted, wherein the first redundant current substantially exceeds the first current;
    a desired data signal configured to combine the first current and the first redundant current into a desired data current;
    a second selector configured to generate a second current when the enable signal is asserted and an inverted normal data signal is negated;
    a second redundant selector configured to generate a second redundant current when the enable signal is asserted and a redundant data signal is negated, wherein the second redundant current substantially exceeds the second current; and
    an inverted desired data signal configured to combine the second current and the second redundant current into an inverted desired data current.

13. The selection module of claim 12, further comprising:
    a current sensor configured to assert a data output when the desired data current is larger than the inverted desired data current and to negate the data output when the desired data current is smaller than the inverted desired data current.

14. The selection module of claim 12, wherein the first selector comprises:
    a first p-channel transistor having a source coupled to a source voltage configured to have a voltage of Vcc and configured to conduct the first current when the enable signal is asserted; and
    a first n-channel transistor connected in a source follower configuration with the first p-channel transistor and configured to conduct the first current when the normal data signal is asserted.

15. The selection module of claim 12, wherein the second selector comprises:
    a second p-channel transistor having a source coupled to a source voltage configured to have a voltage of Vcc and configured to conduct the second current when the enable signal is asserted; and
    a second n-channel transistor connected in a source follower configuration with the second p-channel transistor and configured to conduct the second current when the inverted normal data signal is negated.

16. The selection module of claim 12, wherein the first redundant selector comprises:
a third p-channel transistor having a source coupled to a source voltage configured to have a voltage of Vcc and configured to conduct the first redundant current when the enable signal is asserted; and
a third n-channel transistor connected in a source follower configuration with the third p-channel transistor and configured to conduct the first redundant current when the inverted redundant data signal is asserted.

17. The selection module of claim 12, wherein the second redundant selector comprises:
a fourth p-channel transistor having a source coupled to a source voltage configured to have a voltage of Vcc and configured to conduct the second redundant current when the enable signal is asserted; and
a fourth n-channel transistor connected in a source follower configuration with the fourth p-channel transistor and configured to conduct the second redundant current when the redundant data signal is negated.

18. A semiconductor memory, comprising:
a plurality of normal memory columns, each normal memory column including a normal bit line pair comprising a normal data signal and an inverted normal data signal;
a plurality of redundant memory columns, each redundant memory column including a redundant bit line pair comprising a redundant data signal and an inverted redundant data signal; and
a plurality of selection modules for selecting the redundant bit line pair, if active, rather than the normal bit line pair, comprising:
a first selector configured to generate a first current when an enable signal is asserted and the normal data signal is asserted;
a first redundant selector configured to generate a first redundant current when the enable signal is asserted and the inverted redundant data signal is asserted, wherein the first redundant current substantially exceeds the first current;
a desired data signal configured to combine the first current and the first redundant current into a desired data current;
a second selector configured to generate a second current when the enable signal is asserted and the inverted normal data signal is negated;
a second redundant selector configured to generate a second redundant current when the enable signal is asserted and the redundant data signal is negated, wherein the second redundant current substantially exceeds the second current; and
an inverted desired data signal configured to combine the second current and the second redundant current into an inverted desired data current.

19. The semiconductor memory of claim 18, further comprising:
a plurality of current sensors configured to assert a data output when the desired data current is larger than the inverted desired data current and to negate the data output when the desired data current is smaller than the inverted desired data current.

20. The semiconductor memory of claim 18, wherein the first selector comprises:
a first p-channel transistor having a source coupled to a source voltage configured to have a voltage of Vcc and configured to conduct the first current when the enable signal is asserted; and
a first n-channel transistor connected in a source follower configuration with the first p-channel transistor and configured to conduct the first current when the normal data signal is asserted.

21. The semiconductor memory of claim 18, wherein the first redundant selector comprises:
a third p-channel transistor having a source coupled to a source voltage configured to have a voltage of Vcc and configured to conduct the first redundant current when the enable signal is asserted; and
a third n-channel transistor connected in a source follower configuration with the third p-channel transistor and configured to conduct the first redundant current when the inverted redundant data signal is asserted.

22. The semiconductor memory of claim 18, wherein the second selector comprises:
a second p-channel transistor having a source coupled to a source voltage configured to have a voltage of Vcc and configured to conduct the second current when the enable signal is asserted; and
a second n-channel transistor connected in a source follower configuration with the second p-channel transistor and configured to conduct the second current when the inverted normal data signal is negated.

23. The semiconductor memory of claim 18, wherein the second redundant selector comprises:
a fourth p-channel transistor having a source coupled to a source voltage configured to have a voltage of Vcc and configured to conduct the second redundant current when the enable signal is asserted; and
a fourth n-channel transistor connected in a source follower configuration with the fourth p-channel transistor and configured to conduct the second redundant current when the redundant data signal is negated.

24. The semiconductor memory of claim 18, wherein the semiconductor memory is either a DRAM, SRAM, or a Flash memory.

25. A semiconductor wafer, comprising:
at least one semiconductor memory, comprising:
a plurality of normal memory columns, each normal memory column including a normal bit line pair comprising a normal data signal and an inverted normal data signal;
a plurality of redundant memory columns, each redundant memory column including a redundant bit line pair comprising a redundant data signal and an inverted redundant data signal; and
a plurality of selection modules for selecting the redundant bit line pair, if active, rather than the normal bit line pair, comprising:
a first selector configured to generate a first current when an enable signal is asserted and the normal data signal is asserted;
a first redundant selector configured to generate a first redundant current when the enable signal is asserted and the inverted redundant data signal is asserted, wherein the first redundant current substantially exceeds the first current;
a desired data signal configured to combine the first current and the first redundant current into a desired data current;
a second selector configured to generate a second current when the enable signal is asserted and the inverted normal data signal is negated;
a second redundant selector configured to generate a second redundant current when the enable signal is asserted and the redundant data signal is negated, wherein the second redundant current substantially exceeds the second current; and an inverted desired data signal configured to combine the second current and the second redundant current into an inverted desired data current.

26. The semiconductor wafer of claim 25, further comprising:
a plurality of current sensors configured to assert a data output when the desired data current is larger than the inverted desired data current and to negate the data output when the desired data current is smaller than the inverted desired data current.

27. The semiconductor wafer of claim 25, wherein the first selector comprises:
a first p-channel transistor having a source coupled to a source voltage configured to have a voltage of Vcc and configured to conduct the first current when the enable signal is asserted; and
a first n-channel transistor connected in a source follower configuration with the first p-channel transistor and configured to conduct the first current when the normal data signal is asserted.

28. The semiconductor wafer of claim 25, wherein the second selector comprises:
a second p-channel transistor having a source coupled to a source voltage configured to have a voltage of Vcc and configured to conduct the second current when the enable signal is asserted; and
a second n-channel transistor connected in a source follower configuration with the second p-channel transistor and configured to conduct the second current when the inverted normal data signal is negated.

29. The semiconductor wafer of claim 25, wherein the first redundant selector comprises:
a third p-channel transistor having a source coupled to a source voltage configured to have a voltage of Vcc and configured to conduct the first redundant current when the enable signal is asserted; and
a third n-channel transistor connected in a source follower configuration with the third p-channel transistor and configured to conduct the first redundant current when the inverted redundant data signal is asserted.

30. The semiconductor wafer of claim 25, wherein the second redundant selector comprises:
a fourth p-channel transistor having a source coupled to a source voltage configured to have a voltage of Vcc and configured to conduct the second redundant current when the enable signal is asserted; and
a fourth n-channel transistor connected in a source follower configuration with the fourth p-channel transistor and configured to conduct the second redundant current when the redundant data signal is negated.

31. The semiconductor wafer of claim 25, wherein the at least one semiconductor memory is either a DRAM, SRAM, or a Flash memory.

32. An electronic system, comprising:
at least one input device;
at least one output device;
a processor; and
a memory device comprising at least one semiconductor memory, comprising:
a plurality of normal memory columns, each normal memory column including a normal bit line pair comprising a normal data signal and an inverted normal data signal;
a plurality of redundant memory columns, each redundant memory column including a redundant bit line pair comprising a redundant data signal and an inverted redundant data signal; and
a plurality of selection modules for selecting the redundant bit line pair, if active, rather than the normal bit line pair, comprising:
a first selector configured to generate a first current when an enable signal is asserted and the normal data signal is asserted;
a first redundant selector configured to generate a first redundant current when the enable signal is asserted and the inverted redundant data signal is asserted, wherein the first redundant current substantially exceeds the first current;
a desired data signal configured to combine the first current and the first redundant current into a desired data current;
a second selector configured to generate a second current when the enable signal is asserted and the inverted normal data signal is negated;
a second redundant selector configured to generate a second redundant current when the enable signal is asserted and the redundant data signal is negated, wherein the second redundant current substantially exceeds the second current; and
an inverted desired data signal configured to combine the second current and the second redundant current into an inverted desired data current.

33. The electronic system of claim 32, further comprising:
a plurality of current sensors configured to assert a data output when the desired data current is larger than the inverted desired data current and to negate the data output when the desired data current is smaller than the inverted desired data current.

34. The electronic system of claim 32, wherein the first selector comprises:
a first p-channel transistor having a source coupled to a source voltage configured to have a voltage of Vcc and configured to conduct the first current when the enable signal is asserted; and
a first n-channel transistor connected in a source follower configuration with the first p-channel transistor and configured to conduct the first current when the normal data signal is asserted.

35. The electronic system of claim 32, wherein the second selector comprises:
a second p-channel transistor having a source coupled to a source voltage configured to have a voltage of Vcc and configured to conduct the second current when the enable signal is asserted; and
a second n-channel transistor connected in a source follower configuration with the second p-channel transistor and configured to conduct the second current when the inverted normal data signal is negated.

36. The electronic system of claim 32, wherein the first redundant selector comprises:
a third p-channel transistor having a source coupled to a source voltage configured to have a voltage of Vcc and configured to conduct the first redundant current when the enable signal is asserted; and
a third n-channel transistor connected in a source follower configuration with the third p-channel transistor and configured to conduct the first redundant current when the inverted redundant data signal is asserted.

37. The electronic system of claim 32, wherein the second redundant selector comprises:
a fourth p-channel transistor having a source coupled to a source voltage configured to have a voltage of Vcc and configured to conduct the second redundant current when the enable signal is asserted; and a fourth n-channel transistor connected in a source follower configuration with the fourth p-channel transistor and configured to conduct the second redundant current when the redundant data signal is negated.

38. The electronic system of claim 32, wherein the at least one semiconductor memory is either a DRAM, SRAM, or a Flash memory.

* * * * *